(12) United States Patent
Blank

(10) Patent No.: US 8,430,620 B1
(45) Date of Patent: Apr. 30, 2013

(54) DEDICATED HOT AND COLD END EFFECTORS FOR IMPROVED THROUGHPUT

(75) Inventor: Rich Blank, San Jose, CA (US)

(73) Assignee: Novellus Systems, Inc., Fremont, CA (US)

( * ) Notice: Subject to any disclaimer, the term of this patent is extended or adjusted under 35 U.S.C. 154(b) by 286 days.

(21) Appl. No.: 12/079,242

(22) Filed: Mar. 24, 2008

(51) Int. Cl.
*H01L 21/677* (2006.01)

(52) U.S. Cl.
USPC ................. 414/217; 414/941; 901/30

(58) Field of Classification Search .......... 294/902; 414/941, 217; 901/30
See application file for complete search history.

(56) References Cited

U.S. PATENT DOCUMENTS

| | | | |
|---|---|---|---|
| 5,984,391 A | 11/1999 | Vanderpot et al. | |
| 6,375,746 B1 | 4/2002 | Stevens et al. | |
| 6,405,101 B1 | 6/2002 | Johanson et al. | |
| 6,431,807 B1 | 8/2002 | Stevens et al. | |
| 6,550,484 B1 | 4/2003 | Gopinath et al. | |
| 6,722,835 B1 | 4/2004 | Stevens et al. | |
| 6,877,946 B2 * | 4/2005 | Kinnard et al. | 414/805 |
| 6,934,606 B1 | 8/2005 | Genetti et al. | |
| 6,953,382 B1 | 10/2005 | Korovin et al. | |
| 7,048,316 B1 | 5/2006 | Blank et al. | |
| 7,084,466 B1 | 8/2006 | Lee et al. | |
| 7,229,339 B2 | 6/2007 | Stumpf et al. | |
| 2004/0151574 A1 * | 8/2004 | Lu | 414/816 |
| 2005/0110292 A1 * | 5/2005 | Baumann et al. | 294/64.1 |
| 2005/0220576 A1 * | 10/2005 | Kim et al. | 414/217 |
| 2006/0222480 A1 * | 10/2006 | Duhamel et al. | 414/744.8 |
| 2007/0290150 A1 * | 12/2007 | Krupyshev et al. | 250/559.33 |

OTHER PUBLICATIONS

U.S. Appl. No. 12/627,886, titled "High Throughput Robot Architecture for Semiconductor Processing," Blank, et al., filed Nov. 30, 2009.

* cited by examiner

*Primary Examiner* — Saul Rodriguez
*Assistant Examiner* — Jonathan Snelting
(74) *Attorney, Agent, or Firm* — Weaver Austin Villeneuve & Sampson LLP

(57) ABSTRACT

Methods, systems and apparatuses for high throughput substrate transfer are provided. According to various embodiments, the methods and systems described use robots having dedicated end effectors for hot and cold wafers or other substrates). Throughput is increased by optimizing the transfer of both the hot and the cold wafers. Also described are wafer transfer apparatuses having end effectors configured for supporting either hot or cold wafers. In certain embodiments, dual arm robots having dedicated hot and cold wafer arms are provided. Also provided are methods of transferring substrates that to improve overall throughput. The methods involve transferring hot and cold substrates at different accelerations.

7 Claims, 11 Drawing Sheets

DEDICATED HOT AND COLD END EFFECTORS FOR IMPROVED THROUGHPUT

BACKGROUND

Different types of tools are used to perform hundreds of processing operations during semiconductor device fabrication. Most of these operations are performed in vacuum chambers at very low pressure. Wafers are introduced to the process chambers with wafer handling systems that are mechanically coupled to the process chambers. The wafer handling systems transfer wafers from the factory floor to the process chamber. These systems include loadlocks to bring the wafers from atmospheric conditions to very low pressure conditions and back, and robots to transfer the wafers to various positions. Throughput—the number of wafers that is processed in a period of time—is affected by the process time, the number of wafers that are processed at a time, as well as timing of the steps to introduce the wafers into the vacuum process chambers. What are needed are improved methods and apparatuses of increasing throughput.

SUMMARY

Methods, systems and apparatuses for high throughput substrate transfer are provided. According to various embodiments, the methods and systems described use robots having dedicated end effectors for hot and cold wafers or other substrates. Throughput is increased by optimizing the transfer of both the hot and the cold wafers. Also described are wafer transfer apparatuses having end effectors configured for supporting either hot or cold wafers. In certain embodiments, dual arm robots having dedicated hot and cold wafer arms are provided. Also provided are methods of transferring substrates that to improve overall throughput. The methods involve transferring hot and cold substrates at different accelerations.

DETAILED DESCRIPTION

Figure 1A:
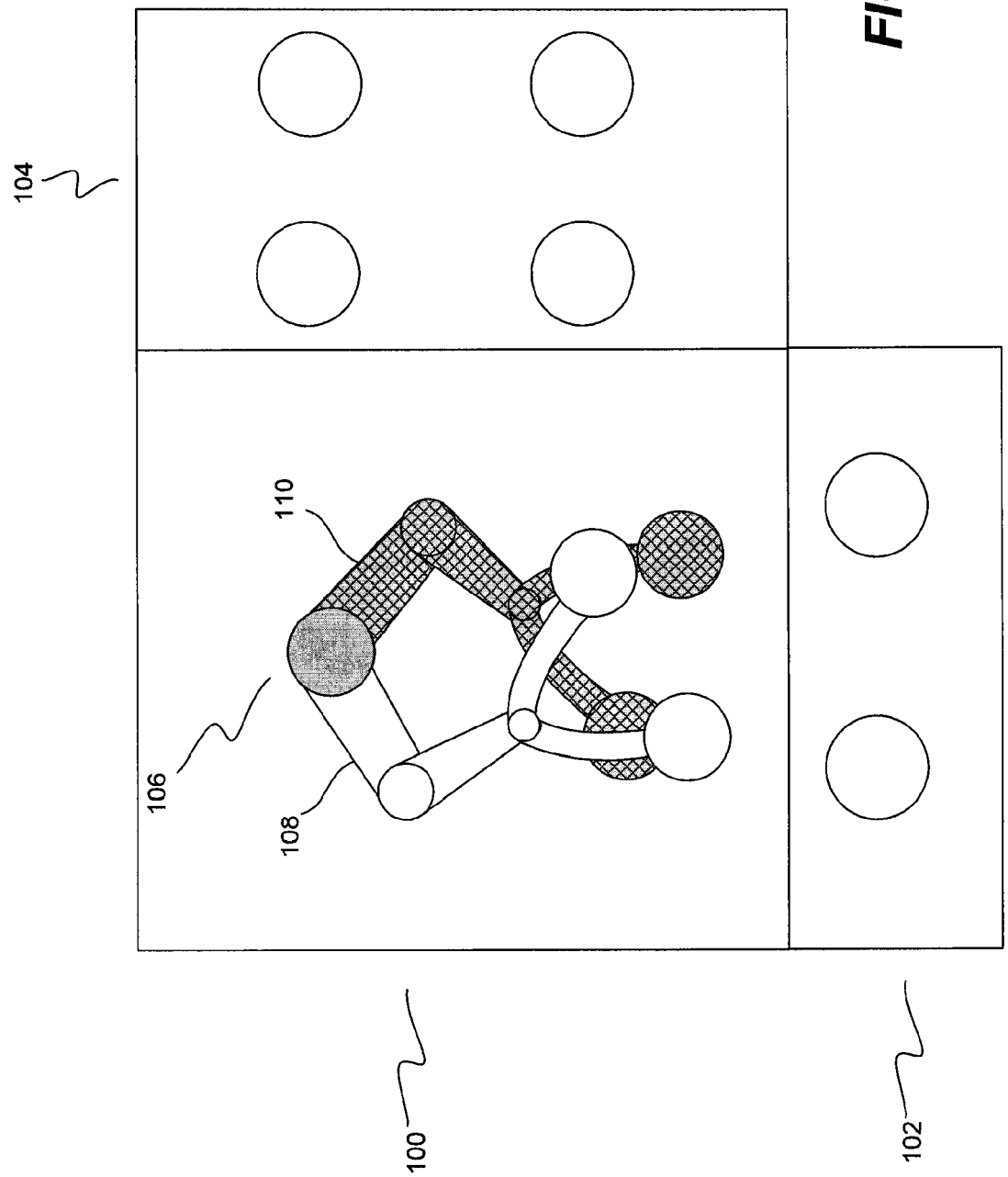
FIG. 1a shows a schematic representation of a top view of a dual arm robot having dedicated hot and cold wafer end effectors in a vacuum transfer module.

Methods, systems and apparatuses used for substrate transport are provided herein. While the methods, systems and apparatuses described can be used for semiconductor manufacturing, it should be understood they could be used in any processes or industries where it is necessary or advantageous to transfer substrates of multiple different temperatures. For the purposes of discussion, the below description refers chiefly to wafers, however one of skill in the art will understand how to implement the methods, systems and apparatuses for other types of substrates and workpieces.

Wafers are often introduced to processing stations or modules via wafer transfer apparatuses during integrated circuit fabrication. In many integrated circuit manufacture processes, wafers are processed at high temperatures—entering a wafer transfer apparatus "cold," typically between about room temperature and leaving the process module "hot," typically between about 300-500 C. For example, a plasma enhanced chemical vapor deposition (PECVD) of a dielectric layer process may operate at a wafer temperature of about 40° C. Examples of other fabrication processes that operate at elevated wafer temperature include deposition of dielectric and conductive layers, etch processes, etc. A robot is used to transfer cold wafers from a first location, e.g., a loadlock or storage location, to a process module for processing, and transfer processed hot wafers from the process module back to the first location or to another location. In many applications, the processes are operated in vacuum environments with a vacuum transfer module used to transfer wafers to and from the process modules. A vacuum transfer module robot may transfer cold wafers from a loadlock or other location to a process module for processing, and transfer processed hot wafers from the process module back to the loadlock or to another location such as a second process module Methods, systems and apparatuses for high throughput substrate transfer are provided herein. The methods and systems use robots having dedicated end effectors for hot and cold wafers. Throughput is increased by optimizing the transfer of both the hot and the cold wafers (or other substrates). Also provided are wafer transfer apparatuses having end effectors configured for supporting either hot or cold wafers. In certain embodiments, dual arm robots having dedicated hot and cold wafer arms are provided. Also provided are methods of transferring substrates that improve overall throughput. The methods involve transferring hot and cold substrates at different accelerations.

An end effector is a device or tool connected to the end of a robot arm, for example, a blade, paddle or gripper. As used herein, the end effector is any such support or device that physically contacts the wafer or other substrate to transport it. End effectors include generally flat supports, such as blades, paddles or forks, on which the wafer sits, as well as devices that hold the wafer in place, such as a gripper. The wafer transfer apparatuses described herein have dedicated end effectors to support hot and cold substrates during substrate transfer—the dedicated hot substrate end effector(s) are exclusively used for transferring hot substrates and the dedicated cold substrate end effector(s) exclusively used for transferring cold substrates. In certain embodiments, robots having dual arms are provided—one arm having one or more dedicated cold wafer end effectors and the other arm having one or more dedicated hot wafer end effectors. In many embodiments, the robots described herein use end effectors on which the wafer sits, however the methods are not limited to such end effectors.

The dedicated end effectors for hot wafers described herein are made of a material that is able to withstand the heat from the wafer. Materials with low thermal conductivity and low coefficients of thermal expansion are used. In many embodiments, ceramics are used, with a specific example being alumina and silicon carbide materials. The dedicated end effectors for cold wafers described herein are made of material that have high coefficients of friction. The coefficient of friction determines the maximum acceleration and deceleration that the end effector and wafer may obtain without wafer slippage. Using materials with high coefficients of friction allow greater acceleration—reducing the time it takes to transport the wafers. As an example, perfluoroelastomers (PFEs) have coefficients of friction around 1. This is compared to a coefficient of about 0.3 for ceramics to silicon. As a result, the acceleration rate obtainable for a wafer on a PFE end effector is more than double than that obtainable for a wafer on a ceramic end effector. Further discussion of the properties and examples of materials suitable for the dedicated hot and cold end effectors is below.

Figure 1B:
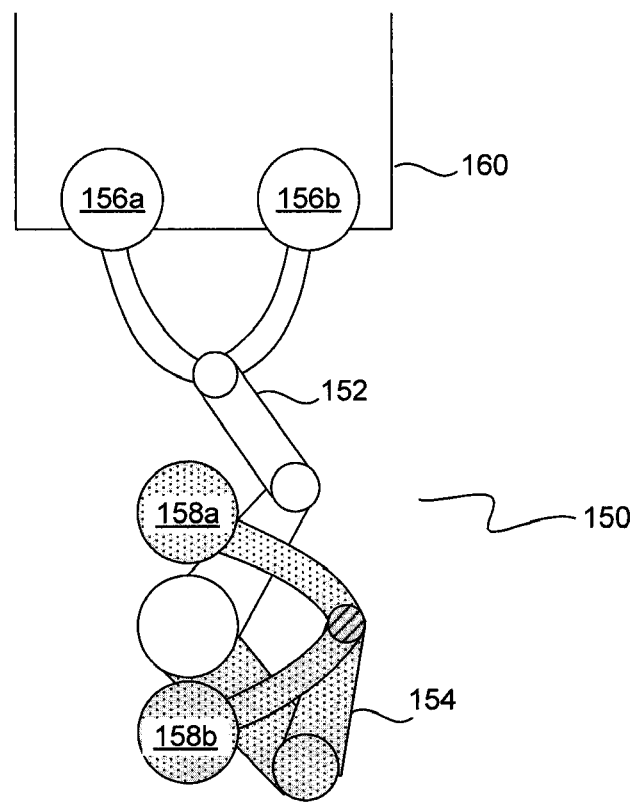
FIG. 1b shows a schematic representation of a dual arm robot having transfer module robot having dedicated hot and cold wafer end effectors, with one arm in an extended position and the other arm in a retracted position.

FIG. 1a shows a schematic representation of a top view of a dual arm robot 106 in a vacuum transfer module 100. The dual arm robot 106 transfers wafers between a loadlock 102 and a process module 104. Robot arm 108 is a dedicated arm for transferring cold wafers, e.g., from the loadlock 102 to the process module 104. Robot arm 110 is a dedicated arm for transferring hot wafers, usually from the process module 104 to the loadlock 102. In the embodiment shown in FIG. 1a, the robot arms have dual end effectors and are each capable of transferring two wafers simultaneously. FIG. 1b is a graphical representation showing a top view of the relative positions of the arms of a dual arm robot according to certain embodiments. In FIG. 1b, a robot 150 has dual arms 152 and 154. Arm 152 is dedicated to transferring cold wafers and arm 154 to hot wafers. Each arm has two end effectors: arm 152 has end effectors 156a and 156b attached to it and arm 154 has end effectors 158a and 158b. In the example of FIG. 1b, the end effectors are paddle-type end effectors that support wafers during transfer. In certain embodiments, the dedicated cold arm takes unprocessed wafers from a loadlock (not shown) transfers them to the process module and places them in the process module, while the dedicated hot arm takes processed wafers from the process module and transfers them to the loadlock. In FIG. 1b, arm 152 is in a forward position, extending into a process module 160. A robot arm extends into a process module or other location during a pick or place move. The movement of a robot to take a wafer from a location such as a processing station is referred to herein as a "pick" move, while the placement of a wafer to a location by the robot is referred to herein as a "place" move. These moves are also referred to herein as "get" and "put" moves, respectively. As indicated, arm 152 is a dedicated arm for cold wafers; thus it places cold unprocessed wafers into the process module 160. Arm 154 picks hot processed wafers from the process module 160, to transfer and place them in a loadlock or other location. To pick hot wafers from the process module, arm 154 is extended into the process module to remove the wafers and arm 152 is retracted. Place and pick moves to and from a loadlock or other location are similarly performed—with the arm pick or placing extended to the location and the other arm retracted. The dual arm robot shown in FIG. 1b is an example of possible dual arm robots having dedicated hot and cold end effectors.

In transferring the wafers between the loadlock and process modules (or between any two locations appropriate for the application), arm and end effector(s) carrying the wafers may be moved at or below the maximum acceleration at which the wafers will not move or slip. In many cases, the arms are moved at some factor below the maximum. Because the hot and cold wafer end effectors are made of materials having different coefficients of friction, the cold wafer end effectors can be moved at higher accelerations (and decelerations). Using a dual arm robot, there are several possible accelerations as described below with reference to an extended or leading arm and a retracted arm. Extended and retracted arms are described in the above paragraph:

Standard Paddles

Wafer on Leading Arm (may be wafer on retracted arm): Low (0.15 g)

No wafer on leading arm but wafer on retracted arm: Medium (0.5 g)

No wafer on either arm: High (1.0 g)

Hot and Cold Paddles

Hot wafer on leading arm: Low (e.g., about 0.15 g)

Cold wafer on leading arm/hot wafer on retracted arm: Low 2 (e.g., about 0.3 g)

Cold wafer on leading arm/no wafer on retracted arm: Low 3 (e.g, about 0.5 g)

Low 3>Low 2>Low

No wafer on leading arm/hot wafer on retracted arm: Medium (e.g., about 0.5 g)

No wafer on leading arm/cold wafer on retracted arm: Medium 2 (e.g., about 0.75 g)

Medium 2>Medium

No wafer on either arm: High (e.g., about 1.0 g)

Table 1 below shows a simplified comparison of robot acceleration and wafer throughput using dedicated hot and cold paddles with that using standard paddles. Moves of a dual arm robot transferring wafers between a loadlock and a process module (as in FIGS. 1a and 1b) are shown, along with achievable acceleration. Place moves involve extending the arm to the place location, placing the wafer, and retracting the arm from the place location. Placing the wafer may involve lowering the wafer onto a wafer support or a lift mechanism lifting the wafer from the end effector. Pick moves involve extending the arm into the pick location, picking the wafer, and retracting the arm from the pick location. Picking the wafer may involve lifting the wafer from a wafer support or lift mechanism. Place and pick moves may involve extension or retraction along a standard or nominal path. In certain embodiments, adjustments are made as necessary for wafer position correction. Wafer position correction is also discussed in application Ser. Nos. 11/998,857 and 11/998,858, both filed Nov. 20, 2007, and incorporated by reference for all purposes. Goto moves involve rotating the arm, e.g., from the process module to the loadlock or vice versa, and/or well as necessary vertical translations. For example, in certain embodiments, vertical translations are used to move between vertically stacked loadlock chambers. In certain embodiments, goto moves also involve moving along a standard nominal path. Also, moves to a process module from a loadlock may involve moving along substantially the same nominal path as moves to the loadlock from the process module and vice versa. For example, in moving to the process module, the dedicated to cold arm may trace in reverse the path taken by the dedicated hot arm in moving to the loadlock from the process module.

In the below description, the following abbreviations are used:

Loadlock—LL

PM—Process Module

ATM Robot—Atmospheric Robot

TM Robot—Transfer Module Robot

WPH—wafers per hour

TABLE 1

Robot acceleration and throughout improvement

| TM Robot | Standard Paddles | Hot and Cold Paddles | Robot Acceleration Change and Throughput Improvement |
|---|---|---|---|
| Goto LL from PM (hot wafer on leading arm) | Low | Low | No |
| Place LL (hot wafer on leading arm/no wafer on trailing) | Low (extension) High (retraction) | Low High | No |
| Goto LL (go between stacked LL chambers) (no wafers) | High | High | No |
| Pick LL (cold wafer on leading/ none on trailing) | Low | Low 3 | Yes |
| Goto PM from LL (cold wafer on leading/none on trailing) | Low (retraction) | Low 3 | Yes |
| Pick PM (hot wafer on leading/ cold on trailing) | Medium (extension) Low (retraction) | Medium 2 Low | Yes |
| Place PM (cold wafer on leading/ hot on trailing ) | Low (extension) Medium (retraction) | Low 2 Medium | Yes |
| Throughput (WPH) | ~150 | ~165 | Yes |

The standard paddles are limited by the lower coefficient of friction materials that are used to carry hot wafers. Dedicated hot and cold paddles allow four of the seven moves to be performed more quickly resulting in improved throughput. Exact throughput depends on various factors including robot used, robot move distance, etc., but in one example, throughput can be improved by about 10%, as shown in the Table 1. The moves and accelerations shown in Table 1 are example of possible process sequence and moves. Although the exact analysis will change based on the robot used and process sequence, in general throughput will be improved for other possible process sequences. This is because the dedicated hot and cold paddles allow greater accelerations/decelerations during some moves than standard paddles. Also as indicated above, dedicated hot and cold end effectors may be on the same arm, with acceleration increased for moves involving only cold wafers.

The surface of the dedicated hot substrate end effector is made of a material that is chemically inert and can withstand the heat from the processed wafers. Processed wafers typically have temperatures ranging from about 300-500 C. Materials that are able to withstand such temperatures include ceramics, such as alumina. Appropriate materials for the hot substrate end effector have low thermal conductivities and/or low coefficients of thermal expansion. According to various embodiments, the hot substrate end effectors have thermal conductivities ranging from about 15 to 45 W/mK at 100 C. According to various embodiments, the hot substrate end effectors coefficients of thermal expansion ranging from about 8 to 10 $((^\circ C.)^{-1} \times 10^{-6})$.

Coefficients of friction for the hot substrate end effector may be as high as allowable without sacrificing the above-described thermal properties. For ceramic end effectors, the coefficient of static friction typically range from about 0.2 to 0.5.

The surface of the cold substrate end effector is made of a material that is chemically inert and has a high coefficient of static friction. According to various embodiments, the coefficient of static friction of the dedicated cold substrate end effector ranges from about 0.75 to 1.5. Examples of materials include perfluoroelastomers (PFEs). Viton® is an example of a fluoroelastomer that may be used. The hot and cold end effectors may be constructed of the material or the material may be applied as a coating or covering on another surface. The above ranges for thermal and mechanical properties of the end effector material depends on the application; for applications in which the substrate is not a semiconductor wafer for example, these ranges may differ.

In certain embodiments, the robots and methods described herein are used to transfer wafers to and from process modules. In certain embodiments, the robots and methods are used in dual wafer transport systems. A description of such a system according to various embodiments is given below with respect to FIGS. 2a-c.

Figure 2A:
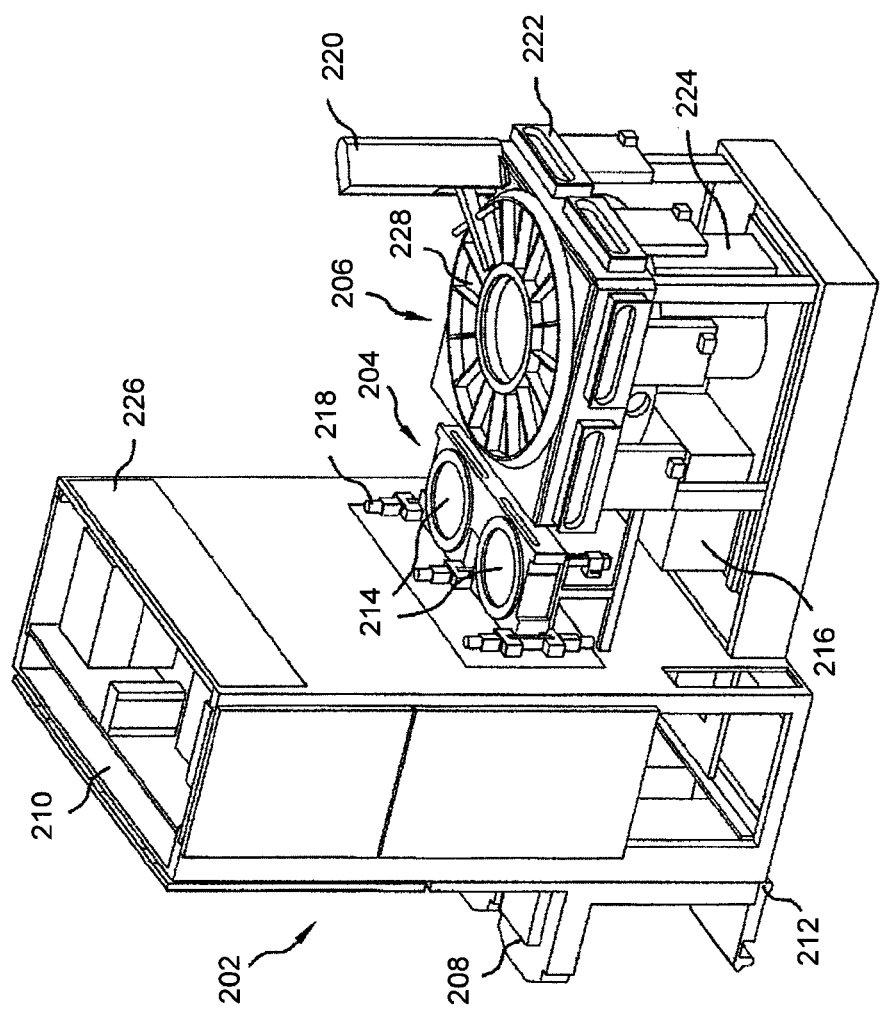
FIG. 2a is a schematic of an exterior of a dual wafer handling apparatus and components thereof according to various embodiments.

FIG. 2a shows an exterior of dual wafer handling apparatus and components thereof. The apparatus shown in FIG. 2a may be used to transfer wafers from atmospheric conditions (e.g, to and from a storage unit) to one or more processing chambers (e.g., PECVD chambers) and back again. The apparatus shown in FIG. 2a has three main components: an atmospheric environment 202, loadlocks 204 and a transfer module 206. Storage units (e.g., Front Opening Unified Pods or FOUPs) and processing chambers are not shown in the figure. Atmospheric environment 202 is typically at atmospheric pressure and interact with FOUPs and/or parts of the external facility. Transfer module 206 is typically at sub-atmospheric pressure and can be in communication with the loadlocks and various processing chambers which are often run at vacuum or low pressure. Wafers are placed in loadlocks 204 for pumpdown or vent operations when transitioning between atmospheric and sub-atmospheric environments.

The atmospheric environment 202 (also referred to as a 'mini-environment') contains an atmospheric robot (not shown) that transfers wafers to and from FOUPs and loadlocks 204. Pod loaders 208 receive and support FOUPs so that they may be accessed by the atmospheric robot. The atmospheric environment 202 typically contains an overhead fan filter unit, e.g., a HEPA filter unit, to prevent contaminants from entering the atmospheric environment. The air inlet 210 for the fan filter unit is shown in FIG. 2. The lower boundary of the atmospheric or mini-environment may be a false floor, such as that depicted in FIG. 2a at 212.

Loadlocks 204 receive inbound (unprocessed) wafers from the atmospheric environment 202 to be transferred to the process chambers, and outbound (processed) wafers from the transfer module 206 to be transferred back to the FOUPs. A loadlock may be bidirectional (holding inbound and outbound wafers) or unidirectional (holding only inbound or outbound wafers). In certain embodiments, the loadlocks are unidirectional. Inbound wafers are also referred to herein as incoming or unprocessed wafers; outbound wafers are also referred to herein as outgoing or processed wafers.

In FIG. 2, there are two independent loadlocks: an upper loadlock stacked on top of a lower loadlock, each having two connected chambers. In certain embodiments, the upper loadlock is an inbound loadlock and the lower loadlock is an outbound loadlock. Plates 214 are lids of the inbound loadlock, each plate covering one of the two connected chambers. Loadlock vacuum pumps 216 are used to pump down the loadlocks as necessary during operation.

Atmospheric valve doors 218 provide access to the loadlocks from the atmospheric environment 202. In the embodiment shown, a four door slit valve externally mounted to the mini-environment is used, though any type of doors or valves including gate valves, sliding doors, rotational doors, etc., may be used.

The transfer module is configured to be attached to one or more process modules (e.g., single or multi-station PECVD chambers, UV cure chambers, etc.). A process module may be attached to the transfer module 206 at multiple interface locations/sides of the transfer module. Slit valves 222 provide access from the transfer module to the process modules. Any appropriate valve or door system may be used. In FIG. 2, there are two valves per side—allowing two wafers to be transferred between a loadlock and a process module (e.g., between two chambers of a loadlock and two adjacent stations of a process module) or between two process modules. Transfer module lift assembly 220 is used to raise and lower the cover 228 of the transfer module. In FIG. 2, cover 228 is down (i.e., the interior of the transfer module is not shown in the figure). A vacuum transfer robot is located in the interior of the transfer module to transfer wafers between the loadlocks and the process modules or from process module to process module.

The transfer module 206 is maintained at sub-atmospheric pressure, and is sometimes referred to herein as a vacuum transfer module. Transfer module pressure is typically between 760 ton-1 miliTorr, though in certain embodiments the tool may be used for even lower pressure regimes. Once an inbound wafer is in place in the loadlock, the loadlock vacuum pumps 216 are used to pump down the loadlock to a sub-atmospheric pressure so that the wafer may be subsequently transferred to the vacuum transfer module. Loadlock slit valves 230 provide access to the loadlocks from the transfer module 206. Transfer module vacuum pump 224, along with a gas mass flow controller (MFC), a throttle valve and a manometer, is used to obtain and maintain the desired pressure of the transfer module. In general, on-tool or off-tool vacuum pumps may be used for the transfer module. As is known in the art, various methods of controlling pressure in the transfer module exist. In one example, a MFC provides a constant flow of $N_2$ gas into the transfer chamber. The manometer provides feedback as to the pressure of the transfer module chamber. The vacuum pump removes a constant volume of gas per unit time as measured in cubic feet per minute. The throttle valve actively maintains a pressure set point through the use of a closed loop control system. The throttle valve reads the manometer's pressure feedback, and based on the commands from the valve's control system, adjusts the opening of the effective orifice to the vacuum pump.

An access panel 226 provides access to an electronics bay that contains a control system to control the wafer handling operations, including robot movements, pressure, timing, etc. The control system may also control some or all operations of processes performed in the process module. The controllers, switches, and other related electrical hardware can be located elsewhere according to various embodiments.

Figure 2B:
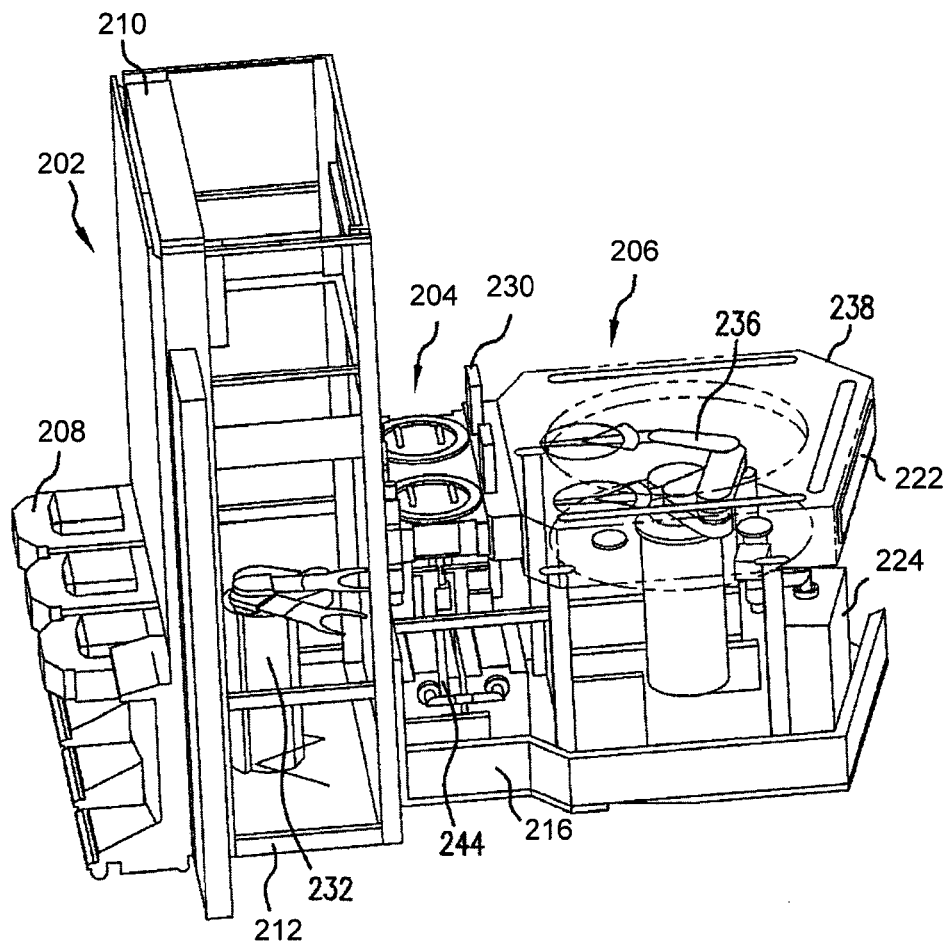
FIGS. 2b and 2c are schematics of a dual wafer handling apparatus showing internal views of the atmospheric environment and the transfer module according to various embodiments.
Figure 2C:
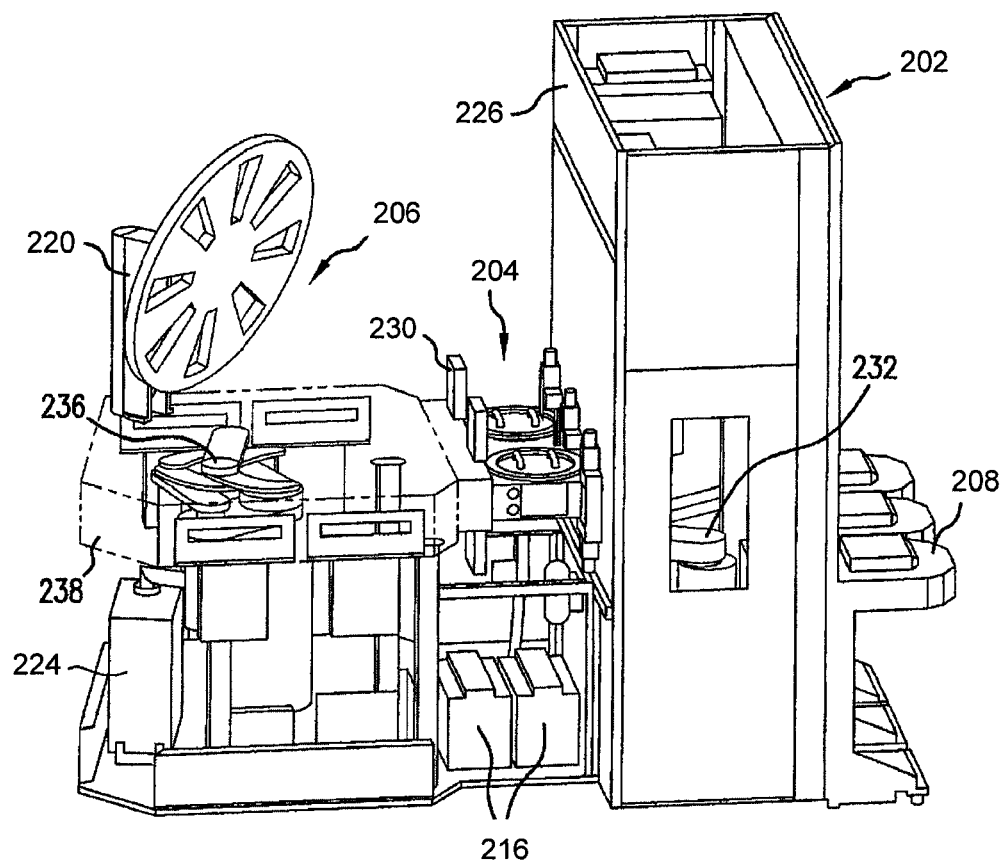

FIGS. 2b and 2c are additional schematics of a dual wafer handling apparatus that show internal views of an atmospheric environment 202 and transfer module 206. The apparatus shown in FIGS. 2b and 2c is substantially the same as that shown in FIG. 2A, with the shape of the transfer module of the apparatus in FIGS. 2b and 2c a trapezoid to allow a larger access 238 area to service the transfer module. The transfer module lift assembly and lid, and a portion of the atmospheric environment casing are not shown in FIG. 2a.

The atmospheric environment 202 contains an atmospheric robot 232. The transfer module 206 contains a vacuum robot 236. In the embodiment depicted in FIG. 2a, the atmospheric robot 232 has one arm, with two articulated wrists, each of which has a paddle or other end effector capable of carrying a wafer. Vacuum transfer robot 236 has two arms, each with two paddles capable of carrying a wafer. The atmospheric robot is capable of handling two wafers simultaneously and the vacuum robot can simultaneously carry up to four wafers. (The apparatus and methods described herein are not limited to these particular robot designs, though in dual wafer transport embodiments each of the robots is capable of handling, transferring, or exchanging at least two wafers.) As described above, according to embodiments of the invention, the vacuum robot has dedicated cold and hot arms.

FIG. 2b also provides a partial view of a pipe 244, also referred to the loadlock pump foreline, that leads from a manifold to the vacuum pumps 244. Dual vacuum pumps 244 work in tandem and are used to pumpdown both loadlocks According to various embodiments, the dual pumps may function as a single pump resource or could be dedicated to a specific loadlock for parallel pump downs. FIG. 2c shows a schematic of the apparatus shown in FIG. 2b from the opposite side. The transfer module lift assembly 220 and the transfer module lid 228 are shown in an upright position.

Figure 3A:
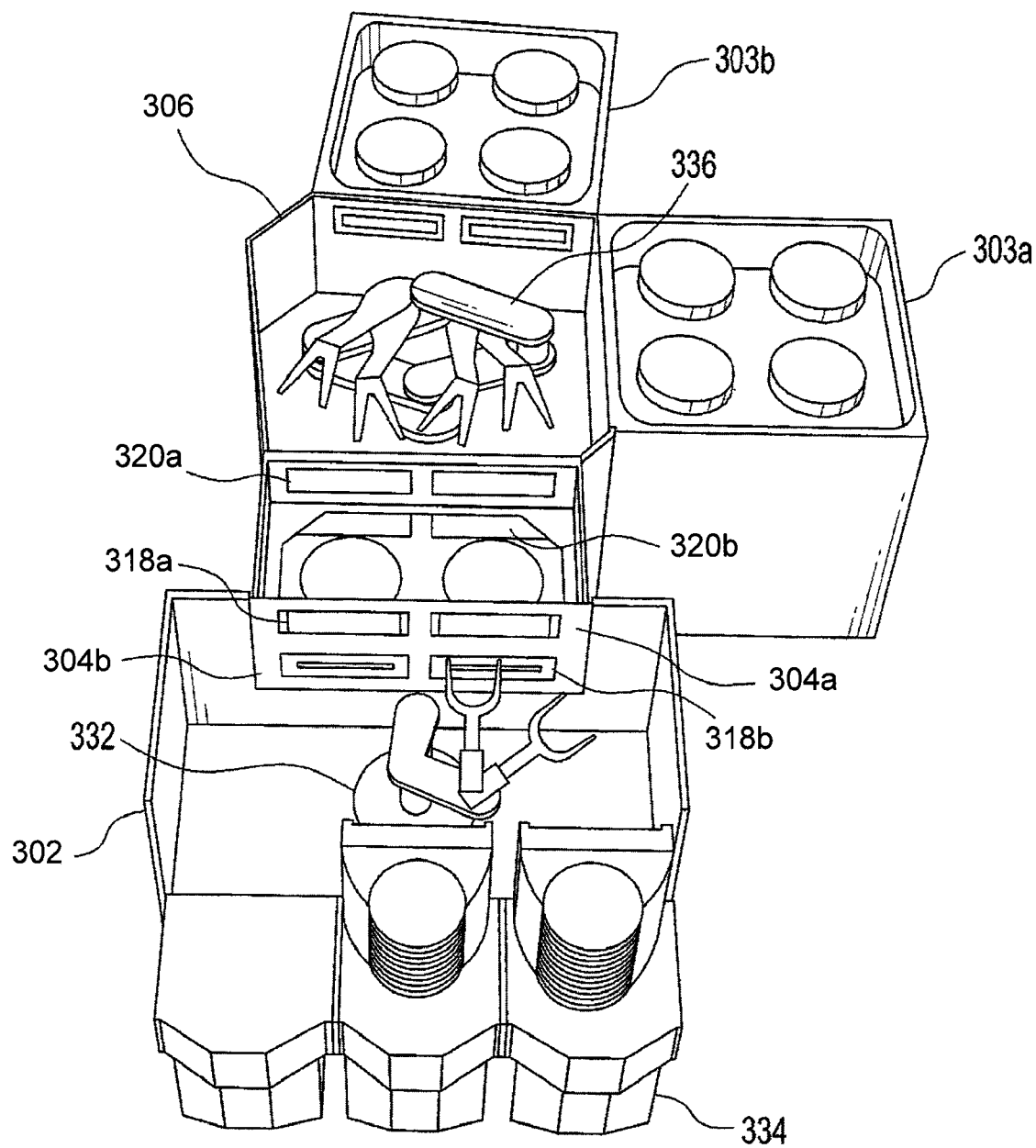
FIGS. 3a-e are graphical representations showing top views of a dual wafer transport apparatus performing certain operations in dual wafer transport of a pair of wafers from a storage cassette to a wafer transfer module and back according to various embodiments.

FIGS. 3a-f are graphical representations showing certain operations in dual wafer transport of a pair of wafers from FOUPs to the wafer transfer module and back. FIG. 3a shows an apparatus with transfer module 306, upper (inbound) loadlock 304a, lower (outbound) loadlock 304b and atmospheric environment 302. Also shown are process modules 303a and 303b. At this point, prior to their entry into atmospheric environment 302, wafers are located in e.g., FOUPs 334, which interface with the atmospheric environment 302. The atmospheric environment 302 contains an atmospheric robot 332; the transfer module 306 contains a vacuum robot 336.

As indicated above, the apparatus is capable of parallel transport and processing of two wafers. Both the atmospheric and vacuum robots are capable of simultaneous handling at least two wafers.

Atmospheric robot 332 has one arm, with two articulated wrists, each of which has gripper capable of carrying a wafer. Vacuum transfer robot 336 has two arms, each with two blades or grippers capable of carrying a wafer. Also, as described above, in embodiments of the invention at least the vacuum robot has a dedicated hot arm and a dedicated cold arm.

Figure 3B:
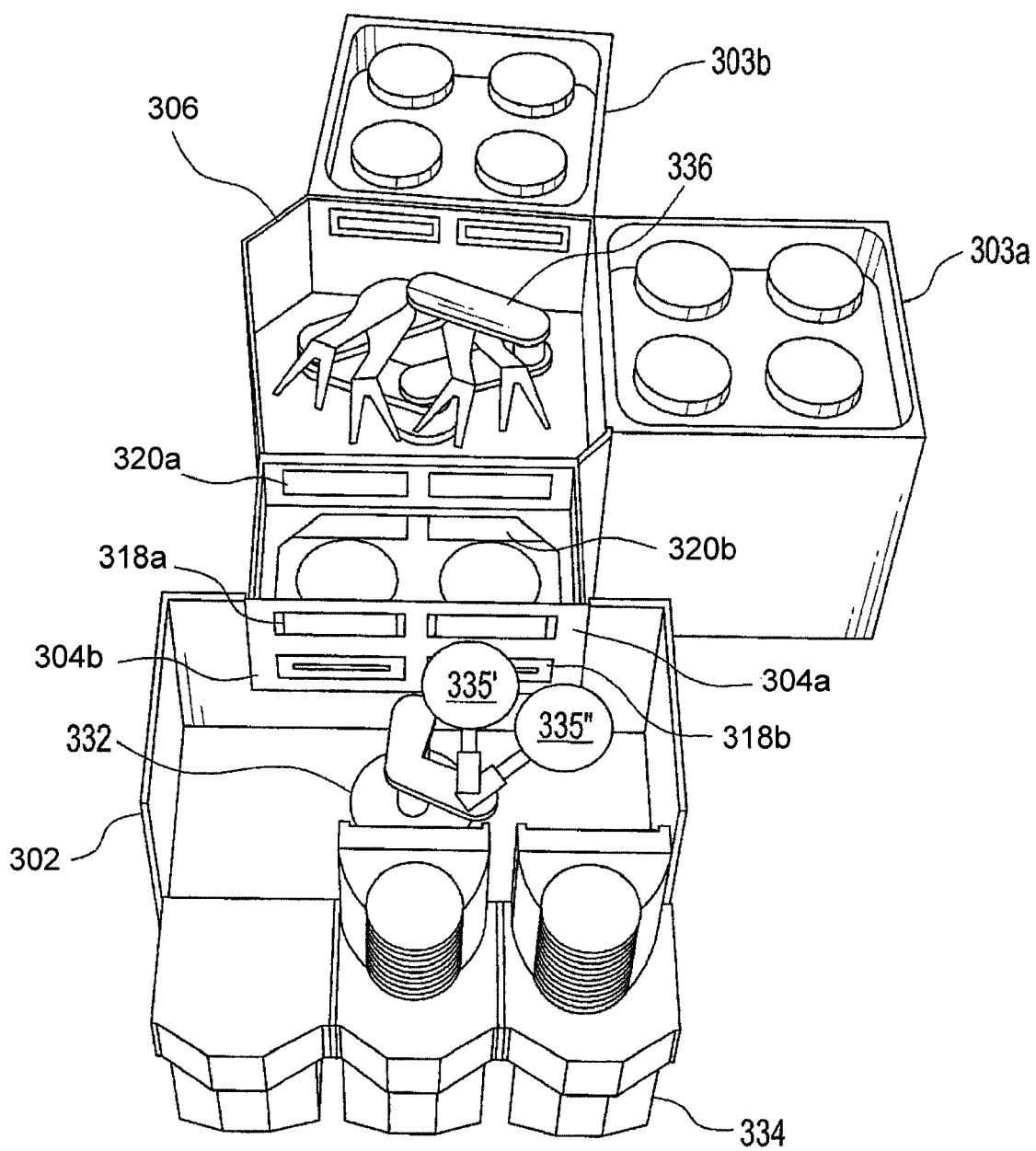
Figure 3C:
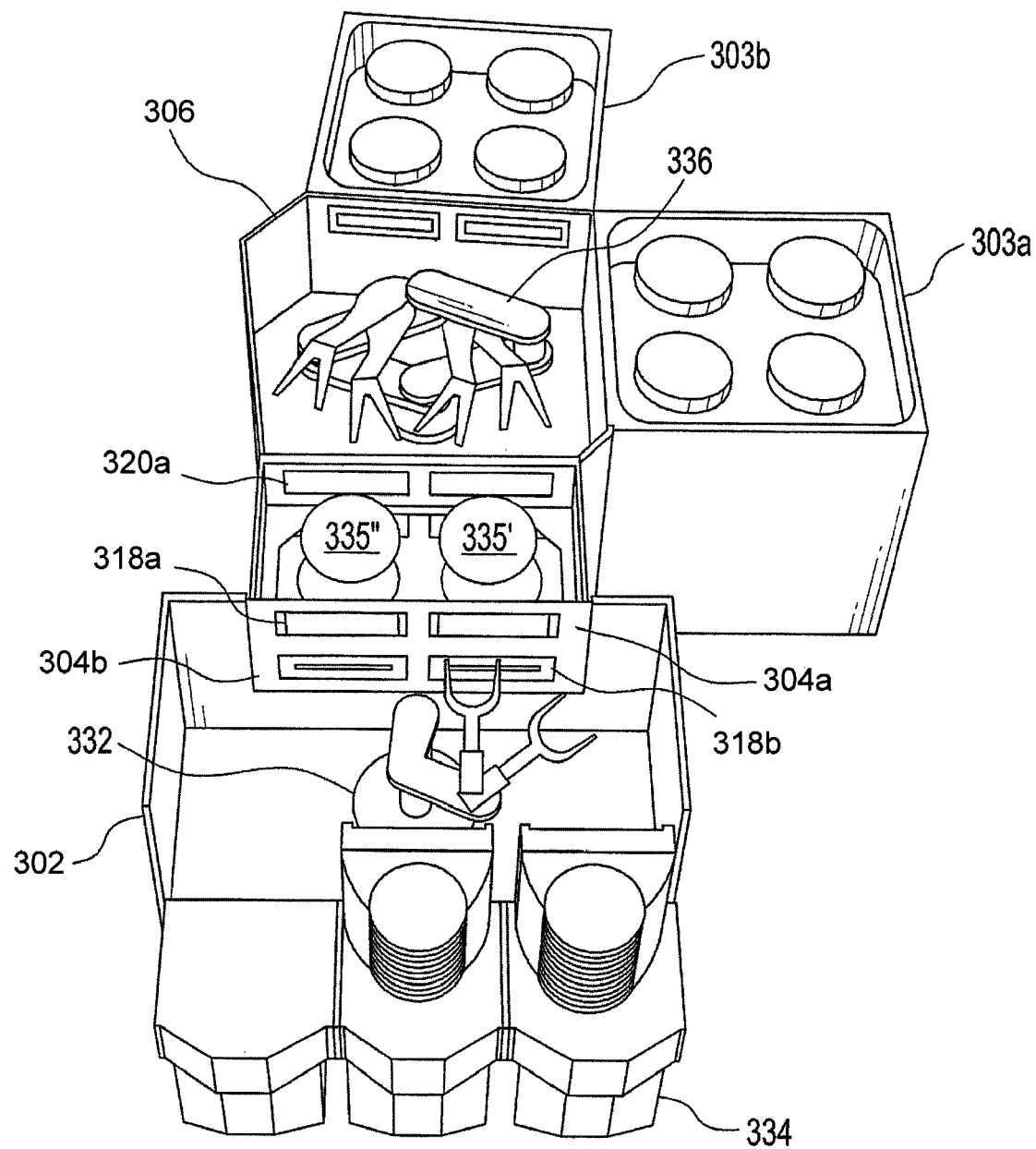
Figure 3D:
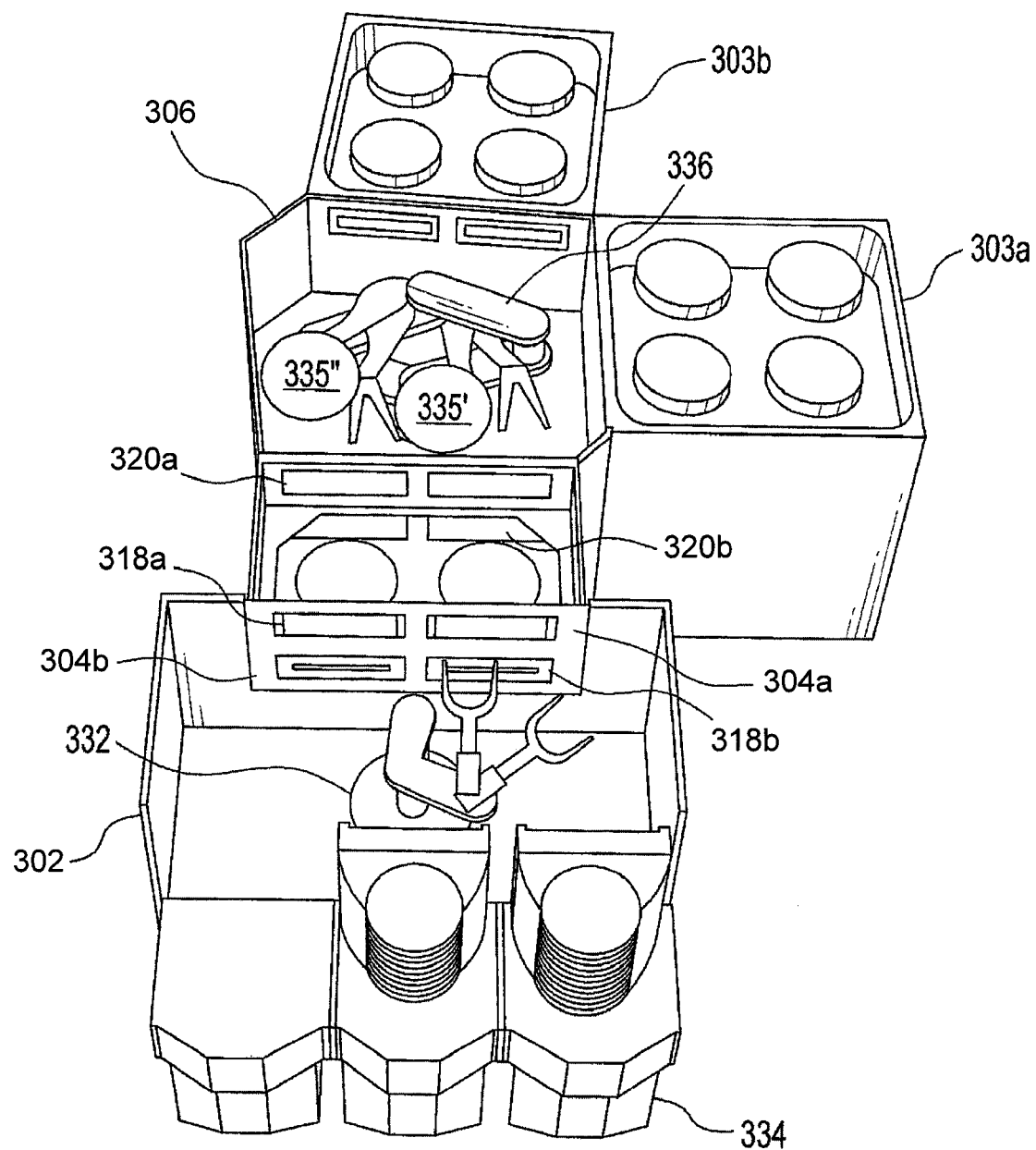
Figure 3E:
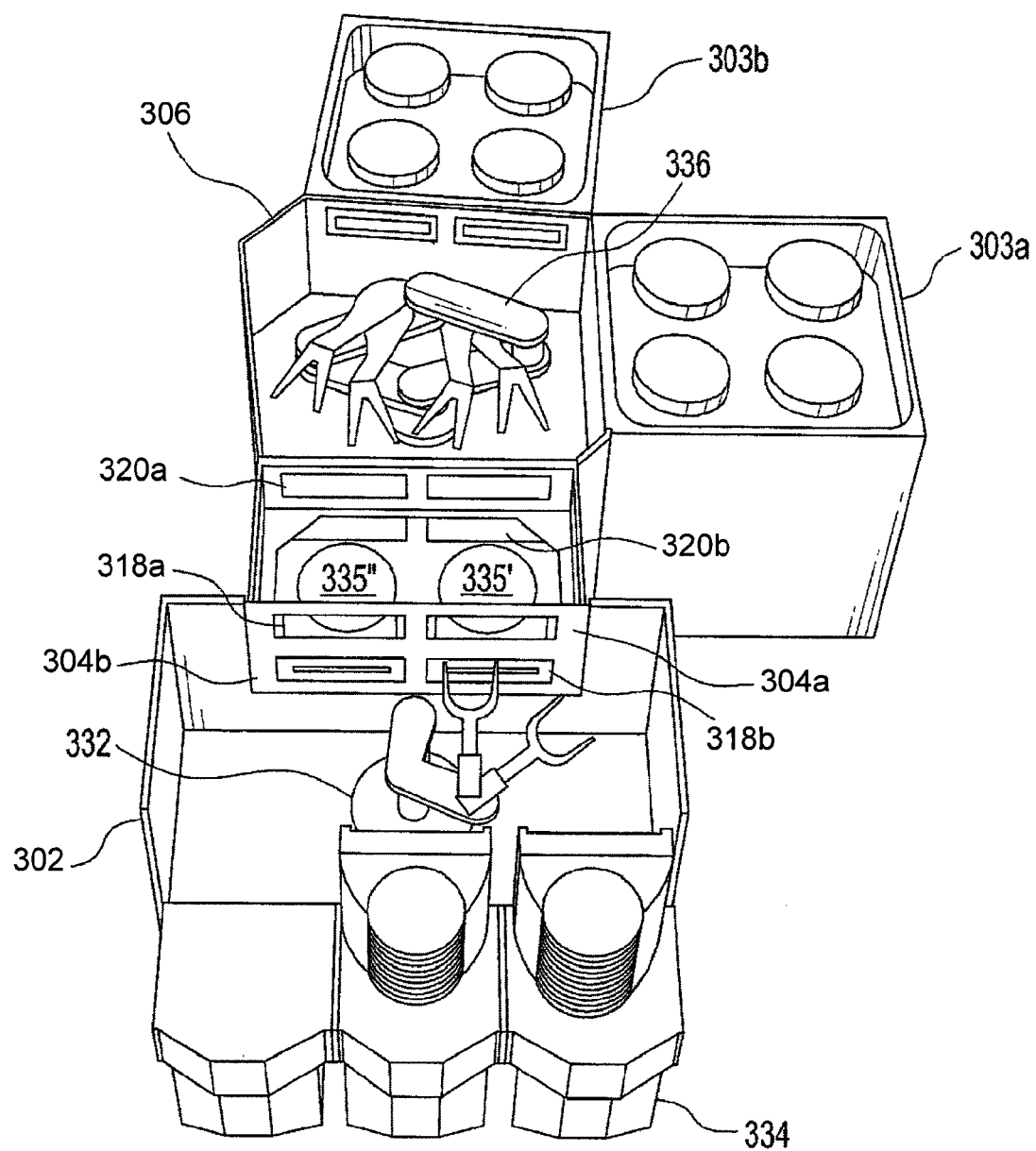
Figure 3F:
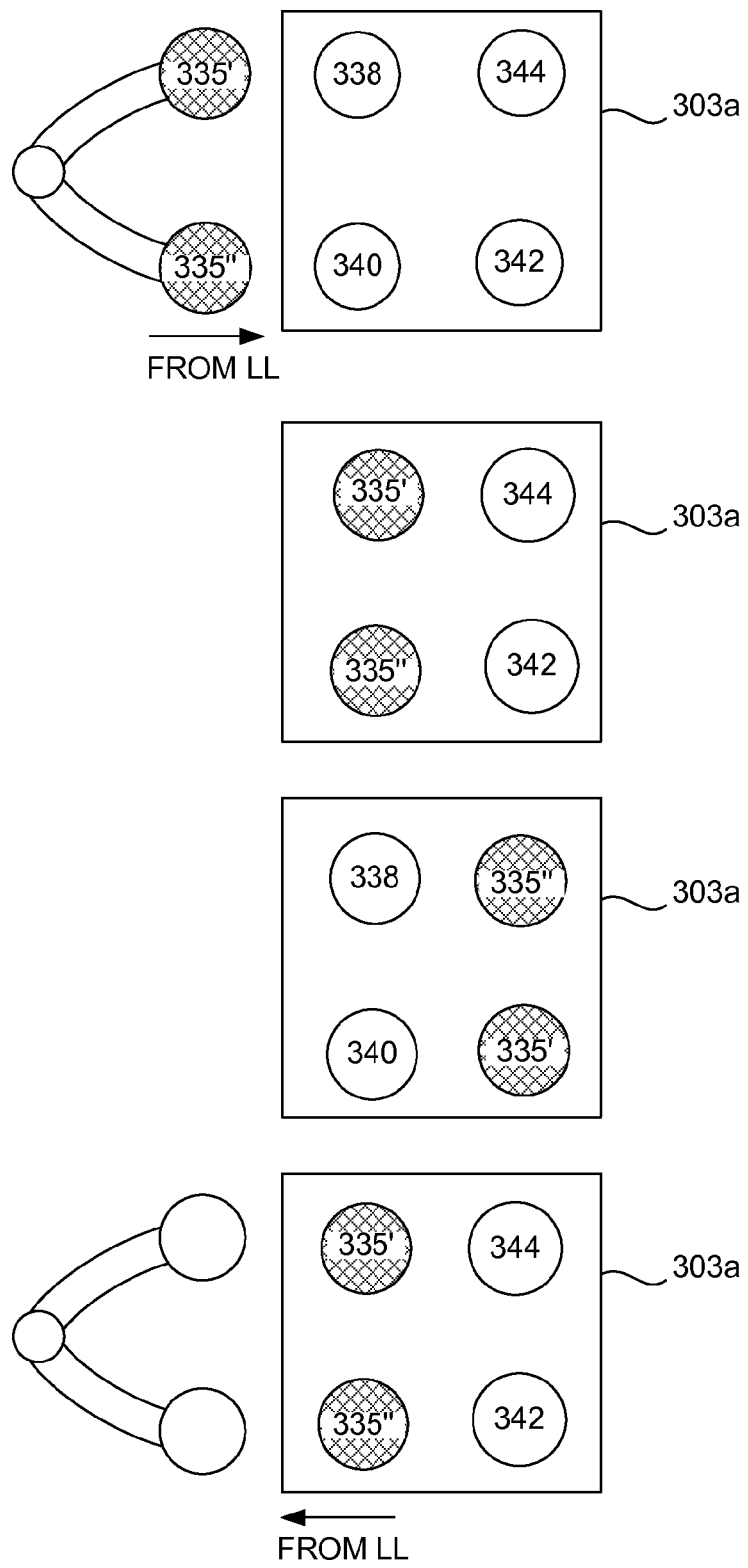
FIG. 3f shows an example of a sequence of movements a pair, of wafers may undergo in a process module according to certain embodiments.

In operation, to process wafers, the atmospheric robot takes two wafers from FOUPs. (As indicated above, the movement of a robot to take a wafer from a location such as a FOUP, loadlock or processing station is sometimes referred to herein as a "pick" move, while the placement of a wafer to a location by the robot is sometimes referred to herein as a "place" move. These moves are also referred to herein as "get" and "put" moves, respectively.) Depending on the robot and the arrangement of the FOUPs or other wafer storage, the two wafers may be taken simultaneously or one after another. In the embodiment depicted in FIG. 3a, for example, the atmospheric robot has one arm with two articulated wrists and is capable of simultaneous transfer of two stacked wafers, e.g., simultaneous picks of two stacked wafers from a FOUP. FIG. 3b shows the atmospheric robot 332 with two wafers 335' and 335" during transfer from the FOUP to the upper loadlock 304a. The atmospheric robot then places the wafers into the upper loadlock 304a for depressurization. This is shown in FIG. 3c. One wafer is in each chamber. Once the wafers are placed in the upper loadlock, the atmospheric doors 318a of the upper loadlock close and the loadlock is pumped down. When the desired pressure is reached, the upper loadlock doors 320a on the transfer module side are open and transfer module robot 336 picks the wafers from the upper loadlock. FIG. 3d shows transfer module robot 336 with wafers 335' and 335". The transfer module robot depicted in FIGS. 3a-e has two arms, each with two end effectors and is capable of holding four wafers simultaneously. Wafers 335' and 335" are unprocessed and so are on dedicated cold end effectors. In the embodiment shown, the upper loadlock does not have an active wafer centering, nor are there independent z-drives for each of the pans of each arm. In certain embodiments, the vacuum robot picks the wafer simultaneously and cannot selectively pick one wafer if two wafers are present in the incoming loadlock. However, depending on the robot and the system, the transfer module robot may pick each wafer simultaneously or consecutively. Also depending on the robot and the system, the robot may use one arm with two end effectors to pick both wafers, or each wafer may be picked by a different arm. After picking the unprocessed wafers from the inbound loadlock, the transfer module robot transfers the wafers to processing module, i.e., either process module 303a or process module 303b, by rotating and placing the wafers in the process module. Although not depicted in FIGS. 3a-e, there may also be a third processing module connected to the transfer module. The wafers then undergo processing in the processing module. FIG. 3f shows an example of a sequence of movements the wafers may undergo in a process module 303a. First, wafer 335' is placed in station 338 of processing module 303a and wafer 335" is placed in station 340 of processing module 303a. The wafers then undergo processing at these stations. Wafer 335" moves from station 340 to station 344 and wafer 335' from station 338 to station 342 for further processing. The wafers are then returned to their original stations to be picked using the dedicated hot wafer end effectors of the transfer module robot for transfer to the outbound loadlock or to processing module 303b for further processing. For clarity, the stations are depicted as 'empty' in the figure when not occupied by wafers 335' and 335", in operation all stations are typically filled by wafers. The sequence illustrated in FIG. 3f is just an example of a possible sequence that may be employed with the apparatuses described herein. The transfer module robot picks both wafers up for simultaneous transfer to the loadlock. The pick moves may occur simultaneously or consecutively. The robot then rotates to place the processed wafers in the loadlock. Again, these moves may occur simultaneously or consecutively according to various embodiments. FIG. 3e shows the now processed wafers 335' and 335" placed in the outbound (lower) loadlock 304b via lower loadlock doors 320b. After being placed there, all loadlock valves or doors are shut and the outbound loadlock is vented (pressurized) to atmospheric pressure. The wafers may also be cooled here. The atmospheric doors 318b of the outbound loadlock are then opened, and the atmospheric robot picks up the processed wafers and transfers them to the appropriate place in the FOUP.

Unidirectional Flow

In certain embodiments, a unidirectional flow scheme is used. An example of inbound and outbound loadlocks, atmospheric robot and transfer module robot moves in a unidirectional flow scheme using dedicated arms for hot and cold wafers is given below in Table 2:

TABLE 2

Robot and Loadlocks Moves in Unidirectional Flow Operation

| ATM Robot | Incoming LL (Upper) | Outgoing LL (Lower) | TM Robot |
|---|---|---|---|
| FOUP Pick (1) | Vent (Empty) | TM Robot | Lower LL Place (hot arm) |
| Upper LL Place (2) | ATM Robot (2) | Vent/Cool (Wafers) | PM Pick (hot arm) |

TABLE 2-continued

Robot and Loadlocks Moves in Unidirectional Flow Operation

| ATM Robot | Incoming LL (Upper) | Outgoing LL (Lower) | TM Robot |
|---|---|---|---|
| Lower LL Pick | Pumpdown (Wafers) (3) | ATM Robot | PM Place (cold arm) |
| FOUP Place | TM Robot (4) | Pumpdown (Empty) | Upper LL Pick (cold arm) (4) |
| FOUP Pick | Vent (Empty) | TM Robot | Lower LL Place (hot arm) |
| Upper LL Place | ATM Robot | Vent/Cool (Wafers) | PM Pick (hot arm) (1') |
| Lower LL Pick | Pumpdown (Wafers) | ATM Robot | PM Place (cold arm) (5) |
| FOUP Place | TM Robot | Pumpdown (Empty) | Upper LL Pick (cold arm) |
| FOUP Pick | Vent (Empty) | TM Robot | Lower LL Place (hot arm) (2') |
| Upper LL Place | ATM Robot | Vent/Cool (Wafers) (3') | PM Pick (hot arm) |
| Lower LL Pick (4') | Pumpdown (Wafers) | ATM Robot (4') | PM Place (cold arm) |
| FOUP Place (5') | TM Robot | Pumpdown (Empty) | Upper LL Pick (hot arm) |

Table 2 presents an example of a sequence of unidirectional operational mode in which the transfer module robot hand-off sequence is process module (wafer exchange)→outgoing loadlock (place processed wafers)→incoming loadlock (pick unprocessed wafers). This is an example of one possible sequence—others may be used with the dual wafer handling apparatuses described herein, including outgoing loadlock accessed before the incoming loadlock.

Rows can be read as roughly simultaneously occurring or overlapping operations. Columns show the sequence of operations the robot or loadlock performs. Of course, in any system, these operations may not overlap exactly and one or more of the modules may be idle or begin or end later. Further, it should be noted that certain operations are not shown. The rotational and translational moves the robots must perform to reach the pods, loadlocks and process modules are not shown. The descriptions 'TM Robot' and 'ATM Robot' can refer to the moves the loadlocks undergo—opening and closing the appropriate doors—as well as admitting the robot end effectors to pick or place the wafers.

The path of a pair of unprocessed wafers going from a FOUP to a process module is traced in the Table in steps 1-5:

1—ATM Robot FOUP Pick
2—ATM Robot Upper Loadlock Place
3—Upper LL Pumpdown (see FIG. 3c)
4—TM Robot Pick
5—TM Robot Process Module Place The path of a pair of processed wafers going from a process module to a FOUP is traced in the Table in steps 1'-5':

1'—TM Robot Process Module Pick
2'—TM Robot Lower LL Place
3'—Lower LL Vent/Cool (see FIG. 3e)
4'—ATM Robot Lower LL Pick
5'—ATM Robot FOUP Place As can be seen from the Table 2, once outgoing wafers are handed off to an atmospheric robot, for example, the loadlock can then be pumped down—it does not have to wait for the atmospheric robot to complete its moves before pumping down. This is distinguished from bidirectional operation in which a loadlock is idle while the atmospheric robot places the processed wafers in a FOUP or other cassette and gets two unprocessed wafers from a cassette for placement into the loadlock. Various robot and loadlock moves according to certain embodiments are described below.

Incoming LL

Pumpdown: Pressure in the upper loadlock is lowered from atmospheric to about 650 mTorr. This pumpdown operation is fairly rapid.

Vent: Vent the upper loadlock from 550 mTorr to atmospheric. No wafer is present. Like the pump down operation, the vent operation is fairly rapid.

Examples of timing of Incoming LL Moves (secs):
Open/Close VAT™ Valve (Valve to Atmospheric environment): 0.5
Open/Close slit valve (valve to transfer module): 0.5
Verify slit valve closed, vent, verify at atmosphere: several seconds
Verify VAT™ door closed, pumpdown and transfer module pressure match: several seconds Outgoing LL Vent/Cool: Vent the lower loadlock from 550 mtorr to atmospheric pressure. Venting is done by flowing gases such as helium and/or nitrogen into the chamber.

Pumpdown: Pump the lower loadlock from atmospheric to 650 mTorr. The chambers are empty.

Examples of timing of Outgoing LL Moves (secs):
Open/Close VAT™ Valve (valve to atmospheric environment): 0.5
Open/Close slit valve (valve to transfer module): 0.5
Verify slit valve closed, He vent, verify at atmosphere: several seconds
Verify VAT™ door closed, pumpdown and transfer module pressure match: several seconds ATM Robot FOUP Pick: The atmospheric robot picks two stacked unprocessed wafers from a FOUP or other cassette. In one embodiment, the end effectors are stacked on top of the other and pick the stacked wafers simultaneously. After picking the wafers, the end effectors are rotated with respect to each other, and the arm is rotated to place the wafers in the upper loadlock (see FIG. 3b, which shows a single arm dual end effector robot holding two wafers ready to place them into the upper loadlock).

Upper LL Place: The atmospheric robot places the wafers into the upper loadlock chambers. In certain embodiments, first one end effector is extended into a chamber of the upper loadlock and lowers the wafer onto the shelf. The end effector is then retracted from the loadlock and the second end effector is extended into the other chamber of the upper loadlock and lowers the wafer onto the shelf.

Lower LL Pick: The atmospheric robot picks the wafers from the lower loadlock chambers. In certain embodiments, first one end effector is extended into a chamber of the upper loadlock and picks the wafer from the pedestal. The end effector is then retracted from the loadlock and the second end effector is extended into the other chamber of the lower loadlock and picks the wafer from the pedestal. In certain embodiments, the robot uses information about the placement of each wafer in the lower loadlock to correct wafer position during the pick move. The atmospheric robot arm is then rotated to place the wafers in the FOUP.

FOUP Place: The atmospheric robot places the wafers into stacked positions in a FOUP. In one embodiment, both wafers are placed simultaneously.

Examples of timing of ATM Robot Moves (secs)
Goto outgoing LL from incoming LL: 0.5
Get wafers from outgoing LL: 5.9
Goto cassette from outgoing LL: 1
Put wafers into cassette: 3
Retract and move in Z-direction in prep for "get" from cassette: 0.3
Get wafers from cassette: 2.5
Goto incoming LL from cassette: 1.3
Put wafers into incoming LL: 6.5

Transfer Module Robot

Upper LL Pick: The transfer module robot extends a dedicated cold wafer dual end effector arm of the transfer module into the upper loadlock and lifts the wafers from the shelves onto the end effectors. In certain embodiments, as one arm is extended into the loadlock, the other arm moves into a retracted position. FIG. 1b shows a dual arm dual end effector robot with one arm extended (e.g., into a loadlock or process module for a pick or place move) and one arm retracted. In the scheme shown in Table 2, the dedicated cold arm is dedicated to taking unprocessed wafers from the upper loadlock and placing them in the process module (cold arm), and the other arm is dedicated to taking processed wafers from the process module and placing them in the lower loadlock (hot arm). In the scheme shown in Table 2, after the upper loadlock pick move, the cold arm retracts and the hot arm is extended into the lower loadlock to place processed wafers there. (Note that in the example discussed with reference to Table 1, the upper loadlock pick move occurs after the lower loadlock place move.)

Lower LL Place: The transfer module robot extends the dedicated hot wafer arm—having a process wafer on each end effector—into the lower loadlock and places them there. In certain embodiments, this is done simultaneously. Position information of each wafer loadlock may be measured and stored for use by the atmospheric robot in picking the wafers. The robot is then positioned for the process module pick move.

Process Module Pick: The transfer module robot extends the dedicated hot arm into the process module and picks the two processed wafers. In certain embodiments, this is done simultaneously. In the scheme shown in Table 2, after the process module pick, the transfer module robot places the unprocessed wafers into the process module.

Process Module Place: The transfer module robot extends the dedicated cold arm—having two unprocessed wafers—into the process module and places them at the stations either by lower the wafers onto the stations, or by wafer supports in the stations lifting the wafers off the end effectors. In certain embodiments, the place moves are done sequentially to allow position corrections to be made in each place move. \

Examples of timing of various transfer module robot moves (secs):
Goto incoming LL from outgoing LL: 1.2
Goto chamber 1 (process module) from LL and goto LL (90°): 1.8
Goto chamber 2 from LL and goto LL (180°): 2.8
Incoming LL "get" (pick): 4.3
Outgoing LL "put" (place): 4.3
Wafer Exchange (processed for unprocessed at process module or chamber): 8.5

In certain embodiments, a controller is employed to control aspects of the wafer transfer processes described above. The controller will typically include one or more memory devices and one or more processors. The processor may include a CPU or computer, analog and/or digital input/output connections, stepper motor controller boards, etc. The controller executes system control software including sets of instructions for controlling the timing, Other computer programs stored on memory devices associated with the controller may be employed in some embodiments. In certain embodiments, there will be a user interface associated with controller. The user interface may include a display screen, graphical software displays of the apparatus and/or process conditions, and user input devices such as pointing devices, keyboards, touch screens, microphones, etc.

The computer program code for controlling the transfer and position error correction and other processes in a process sequence can be written in any conventional computer readable programming language: for example, assembly language, C, C++, Pascal, Fortran or others. Compiled object code or script is executed by the processor to perform the tasks identified in the program. Parameters may be provided to the user in the form of a recipe, and may be entered utilizing the user interface. Signals for monitoring the process may be provided by analog and/or digital input connections of the system controller. The signals for controlling the process are output on the analog and digital output connections of the apparatus. The system software may be designed or configured in many different ways. For example, various transfer apparatus component subroutines or control objects may be written to control operation of the apparatus components necessary to carry out the inventive transfer processes. Examples of programs or sections of programs for this purpose include code for controlling which arm and/or end effector is used to pick up processed or hot wafers and code controlling which arm and/or end effector is used to pick up unprocessed or cold wafers wafers. The robot typically has its own controller, with speeds preset. A system controller may also include code to run pumpdown/vent or process module operations.

What is claimed is:

1. A wafer processing system comprising:
a dual end effector robot said dual end effector robot comprising a) a first end effector for supporting a semiconductor substrate, said first end effector having a first top surface configured to contact a semiconductor substrate during substrate transfer, wherein said first top surface comprises a first material having a first coefficient of friction, and b) a second end effector for supporting a semiconductor substrate, said second end effector having a second top surface configured to contact a semiconductor substrate during substrate transfer, wherein said second top surface comprises a second material having a second coefficient of friction, wherein the first and second coefficients are different and wherein the first and second end effectors are on different arms;
at least one processing chamber;
a transfer chamber connected to said at least one processing chamber; and
a loadlock connected to said transfer chamber, wherein said dual end effector robot is located within said transfer chamber and is configured to transfer wafers directly between said loadlock and said at least one processing chamber such that the first and second end effectors are both configured to transfer wafers directly between said loadlock and said at least one processing chamber, and further wherein transferring a wafer between a loadlock and a processing chamber includes pick and place moves to or from the loadlock and processing chamber.

2. The wafer process system of claim 1 wherein the first material is a ceramic material.

3. The wafer process system of claim 2 wherein the second material is an elastomeric material.

4. The wafer process system of claim 1 wherein the first material has a coefficient of friction of about 0.2-0.5.

5. The wafer process system of claim 1 wherein the second material has a coefficient of friction of about 0.9-1.1.

6. The wafer process system of claim 1, further comprising a controller having machine readable instructions, said instructions comprising code to transfer unprocessed wafers from the loadlock to the at least one processing chamber using the first end effector and to transfer processed wafers from the at least processing chamber to the loadlock using the second end effector.

7. The wafer process system of claim 6, wherein said instructions comprise code to move the first effector at an acceleration of at least about 0.7 g during transfer of the unprocessed wafers and code to move the second end effector at an acceleration of no more than 0.5 g during transfer of the processed wafers.

\* \* \* \* \*